United States Patent
Kamide et al.

[11] Patent Number: 5,827,436
[45] Date of Patent: Oct. 27, 1998

[54] METHOD FOR ETCHING ALUMINUM METAL FILMS

[75] Inventors: Yukihiro Kamide; Yuji Takaoka, both of Kanagawa; Yasuaki Yamamichi, Nagasaki, all of Japan

[73] Assignee: Sony Corporation, Japan

[21] Appl. No.: 616,964

[22] Filed: Mar. 15, 1996

[30] Foreign Application Priority Data

Mar. 31, 1995 [JP] Japan ................................... 7-074980

[51] Int. Cl.⁶ ............................... C23F 1/20; H01L 21/00
[52] U.S. Cl. ........................... 216/77; 438/707; 438/720; 438/732; 438/733; 438/738; 438/742
[58] Field of Search ............................ 156/634.1, 643.1, 156/644.1, 651.1, 652.1; 437/194; 216/77

[56] References Cited

U.S. PATENT DOCUMENTS

| | | | |
|---|---|---|---|
| 4,505,782 | 3/1985 | Jacob et al. ............................. | 156/643 |
| 4,986,877 | 1/1991 | Tachi et al. ............................. | 156/643 |
| 5,259,922 | 11/1993 | Yamano et al. ......................... | 156/643 |
| 5,376,211 | 12/1994 | Harada et al. .......................... | 156/345 |
| 5,404,079 | 4/1995 | Ohkuni et al. ...................... | 315/111.81 |
| 5,428,234 | 6/1995 | Sumi ...................................... | 257/287 |

FOREIGN PATENT DOCUMENTS

| | | | |
|---|---|---|---|
| 56-83943 | 7/1981 | Japan ...................................... | 216/77 |
| 60-142519 | 12/1985 | Japan . | |
| 2-058831 | 2/1990 | Japan ...................................... | 21/302 |
| 2-58831 | 2/1990 | Japan . | |
| 3-295234 | 12/1991 | Japan . | |

OTHER PUBLICATIONS

Wolf, Silicon Processing for the VLSI Era, vol. 1: Process Technology, Lattice Press, pp. 332–334, 574, 1986.

*Primary Examiner*—R. Bruce Breneman
*Assistant Examiner*—Jeffrie R. Lund
*Attorney, Agent, or Firm*—Ronald P. Kananen

[57] ABSTRACT

A mixed etching gas consisting of boron trichloride, a rare gas, and chlorine is used for etching of an aluminum metal film by dry-etching. In the first step, high frequency power is used to etch and remove alloy grains which tend to form residues and to etch an aluminum metal film in an anisotropic mode. Just before the under-layered silicon film is exposed, the frequency power is lowered but is kept higher than the minimum power required for anisotropic etching to enable etching selectivity with respect to the silicon dioxide film to be achieved.

20 Claims, 4 Drawing Sheets

METHOD FOR ETCHING ALUMINUM METAL FILMS

BACKGROUND OF THE INVENTION

1. Field of the Invention

This invention provides a method used for forming wiring on a semiconductor device, and particularly relates to a method for etching aluminum metal films in which an aluminum metal film is dry-etched.

2. Description of the Related Art

For aluminum wiring of semiconductor integrated circuits, an improvement in coverage by using a thin resist film of an etching mask, using high concentration additives (for example, copper concentration in an aluminum-silicon-copper alloy or an aluminum-copper alloy) and high temperature treatment, has been required to accompany the minimization of wiring. As one of these methods, a method in which an aluminum metal film consisting of a material in which silicon and copper are added to aluminum, has been used.

Figure 4A:
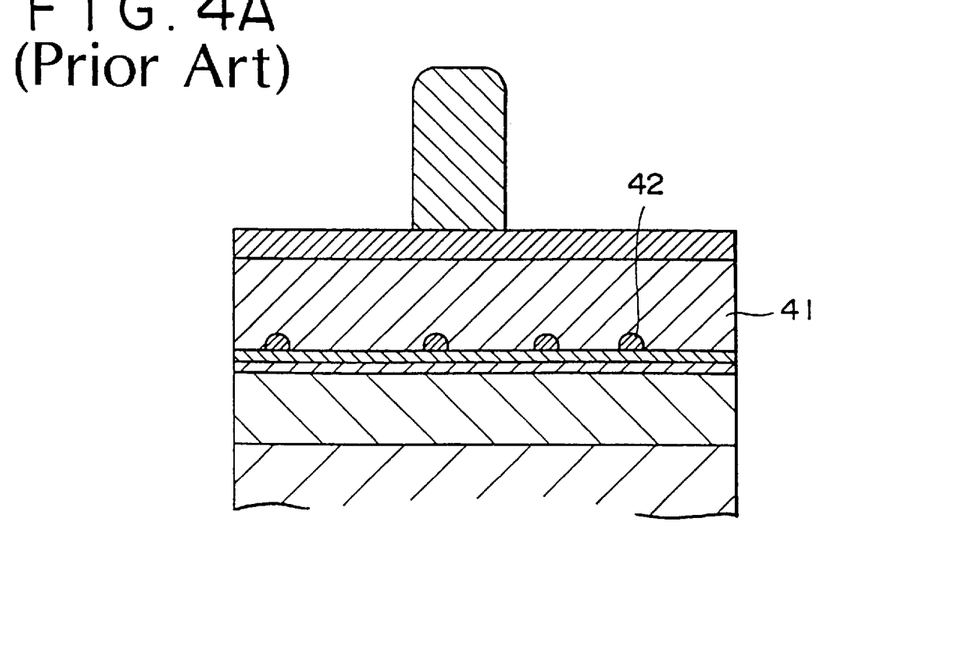
FIGS. 4A to 4C are schematic diagrams showing the problem the invention is directed to solving.

However, in the case of an aluminum metal film 41 made from silicon or copper added to aluminum as shown in FIG. 4A, the increased amount of these additives results in an increase in binary alloy grains and so called nodules which often cause residues.

Figure 4B:
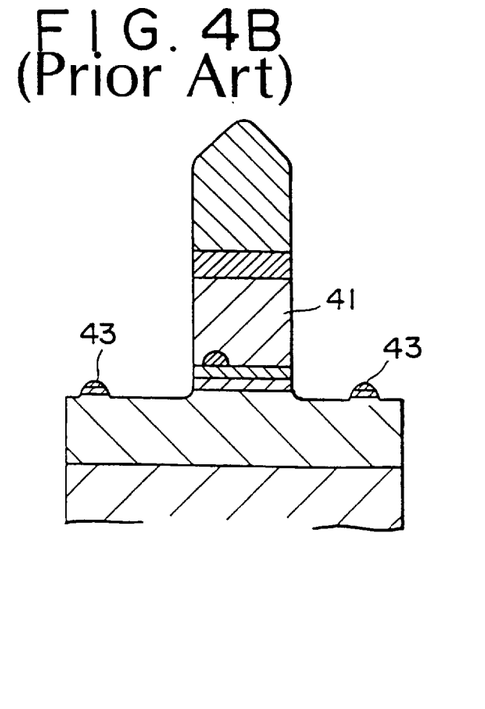

Consequently, when etching is carried out under a condition of low ion energy (for example, 310 eV or so) as shown in FIG. 4B, residues 43 are formed. It is difficult to etch an aluminum metal film 41 without forming residues. More binary alloy grains 42 or nodules, which cause residues 43, are formed by high temperature treatment.

In conventional aluminum wiring processes, when etching residues are formed because of an additive contained in the aluminum metal film 41, ion energy for etching is simply increased to intensify the action of sputter etching, whereby the residues are removed.

Figure 4C:
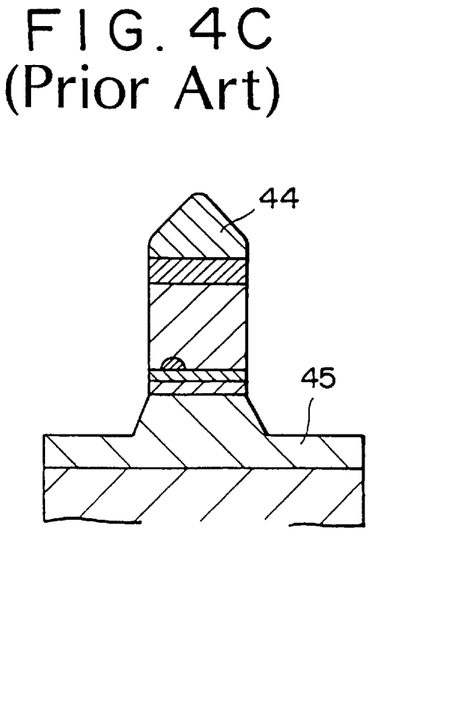

In the event that intensified sputter etching is used, additional resist pattern 44 is inevitably removed, thus, it is required to form a resist film with an excessive thickness. Also, an interlayer insulating film 45, which is an under layer of the metal film, is removed deeply. Therefore, this method can not be used to devices having a thin interlayer insulating film.

Currently, in the semiconductor device industry, the trend for semiconductor devices is moving toward fine patterns, which are manufactured by using a thinner resists. Therefore, it tends to cause increased local level gaps due to the deep removal of an under-layered interlayer insulating film.

Accordingly, it is required to reduce the removal of the under-layered interlayer insulating film during etching. Also, of course, no copying of residues is desirable.

On the other hand, a method in which a reactive gas (for example, nitrogen and hydrogen bromide) is added to an etching gas was proposed to solve the above-mentioned problem. However, this method is disadvantageous because the more effective the gas is, the more the so-called particles are formed. Of course, it is possible to reduce the particle generation by improving the etching equipment, but this raises the equipment cost.

Instead of simply increasing ion energy, it is possible to reduce radical density in an etching atmosphere to achieve a reduction in residues. However, if priority is given to the removal of residues, and ion energy and radical density are balanced, the etching speed of an aluminum metal film is lowered and results in an undesirable reduced selectivity ratio to a resist film, which is the etching mask.

It is therefore an object of the present invention to provide a method for etching aluminum metal films which enables the high performance processing of an aluminum metal film using existing etching equipment.

SUMMARY OF THE INVENTION

The present invention is a method for etching an aluminum metal film, and the invention is accomplished to realize the above-mentioned object.

In detail, a mixed gas comprising boron trichloride, a rare gas, and chlorine is used as an etching gas for processing an aluminum metal film by a dry-etching method.

The present invention is a method for etching comprising a first process in which, when an aluminum metal film is processed by dry-etching under application of high frequency power to a substrate, high frequency power of such high power that the aluminum metal film is subjected to anisotropic etching and alloy grains contained in the aluminum metal film are etching removed; and a second process, in which, from or just prior to the time point when a silicon dioxide film layered under the aluminum metal film is exposed, the high frequency power is so controlled that the power applied to a substrate in the second process is lower than the power applied in the first process, higher than the lower limit for anisotropic etching of the aluminum metal film, and has the etching selectivity to the under-layered silicon dioxide film.

In the above-mentioned method for etching an aluminum metal film, an etching gas comprising boron trichloride, a rare gas, and chlorine is used for dry etching of an aluminum metal film; therefore, alloy grains contained in the aluminum metal film are removed by the rare gas, and thus the generation of residues is suppressed.

In the above-mentioned method for forming an aluminum metal wiring, the high frequency power of such high power that the aluminum metal film is subjected to anisotropic etching and alloy grains contained in the aluminum metal film are etching-removed, is applied to the substrate in the first process; therefore, residues due to the alloy grains contained in the aluminum metal film are not formed. From or just prior to the time point when the silicon dioxide film which is formed under the aluminum metal film is exposed, the high frequency power, of such controlled power that the power in the second process is lower than the power in the first process, higher than the lower limit for anisotropic etching of the aluminum metal film, and has the etching selectivity to the under-layered silicon dioxide film, is applied to the substrate in the second process; therefore, the under-layered silicon dioxide film is scarcely etched.

DETAILED DESCRIPTION OF THE PREFERRED EMBODIMENTS

The first embodiment of the present invention is described with reference to the schematic process diagrams shown in FIGS. 1A, 1B and 1C. Herein, as an example, a method for forming wiring is shown. The numerals used in the description represent only one example, and the present invention is not limited to the structure shown by the numerals.

Figure 1A:
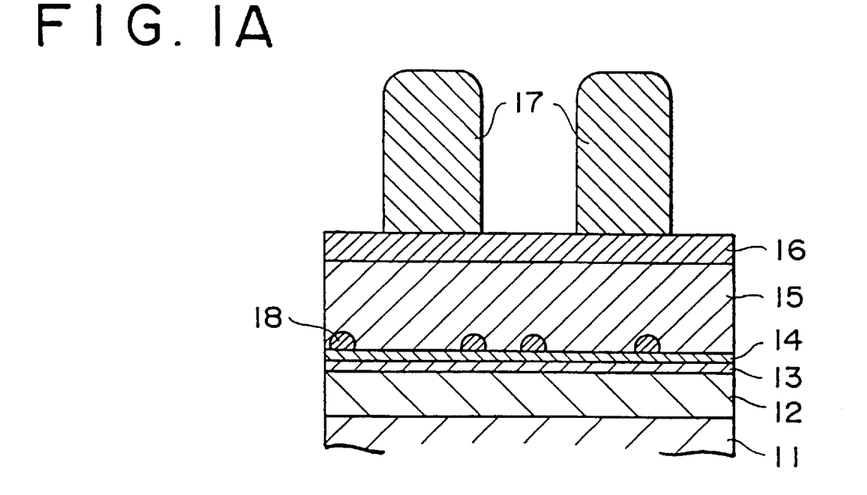
FIGS. 1A to 1C are schematic process diagrams showing an etching process according to an embodiment of the present invention.

As shown in FIG. 1A, a silicon dioxide film 12 is formed on a substrate 11, and thereon, a titanium film 13 with a thickness of 20 nm, which thickness is the critical thickness to be a so-called barrier metal film, and a titanium nitride 14 are formed. On the film, an aluminum metal film 15 consisting of an aluminum-copper (0.5%) alloy with a thickness of 500 nm for forming the wiring is formed. On the aluminum film, a titanium nitride film 16 with a thickness of 100 nm which is to be so called cap metal film is formed.

One example of a sputtering condition is described in the following.

For forming the above-mentioned aluminum film 15 by sputtering, the following sputtering condition is employed. A target consisting of an aluminum-copper (0.5%) alloy is used, where the flow rate of argon, which is a sputtering gas, is 200 sccm (here, sccm represents the unit of flow rate in the standard condition in $cm^3/min$), the pressure of a sputtering atmosphere is 270 Pa, the high frequency power is 1.5 kW, and the substrate temperature is 300° C.

The sputtering conditions for forming the titanium film 13 are as follows. A target consisting of titanium is used, and the other conditions are the same as prescribed for sputtering the above-mentioned aluminum metal film 15.

For forming the titanium nitride films 14 and 16 by sputtering, a target consisting of titanium is used, under conditions in which the flow rate of nitrogen gas, which is a sputtering gas, is 200 sccm, the same pressure of a sputtering atmosphere, high frequency power, and substrate temperature as prescribed for the sputtering of the above-mentioned aluminum metal film 15 are prescribed.

Next, a resist pattern 17 which is to be an etching mask is formed with a lithography technique (for example, resist coating, exposing, developing, and baking). The resist pattern 17 is, for example, a resist pattern exposed to an i-beam, the minimum stroke width is 0.40 $\mu$m, and the film thickness is 1.1 $\mu$m.

The above-mentioned film forming condition is a popular condition for wiring material, and is an example of the difficult compatibility between the removal of residues and resist selectivity ratio due to increased substrate temperature during sputtering.

Figure 1B:
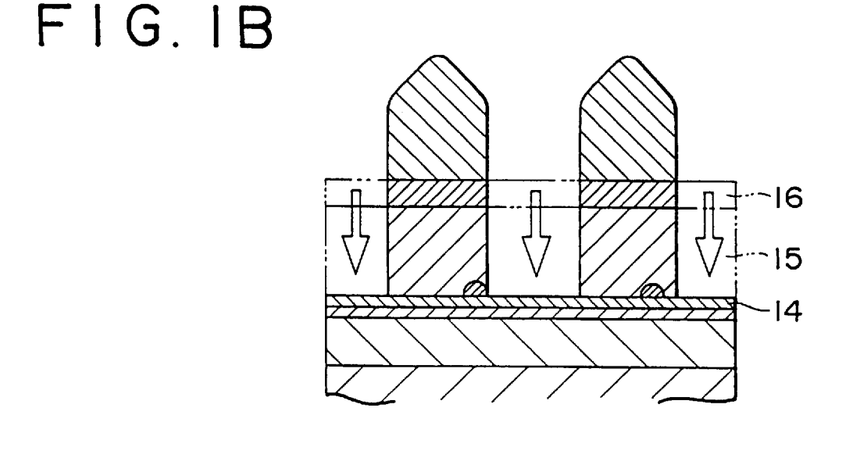

The layers are etched as shown in FIG. 1B. A magnetron microwave plasma etching equipment is used as the etching equipment. Detailed processing conditions are described hereinafter.

A mixed gas, consisting of boron trichloride($BCl_3$) of a flow rate of 10 sccm, chlorine ($Cl_2$) of a flow rate of 60 sccm, and argon (Ar) of a flow rate of 30 sccm, is used as the etching gas. The pressure of an etching atmosphere and a magnetron filament current are prescribed to 1.067 kPa and 200 mA respectively. The high frequency power is applied in the two steps or processes: (a) 80 W for the first process (corresponding to an ion energy of 530 eV); and (b) 50 W for the second process (corresponding to an ion energy of 310 eV). The temperature of the substrate is controlled to 30° C.

The only difference between the first process and the second process is the level of the high frequency power.

In the first etching process, the titanium nitride film 16 and aluminum metal film 15 are subjected to anisotropic etching. Then, the alloy grains shown in FIG. 1A consisting of aluminum and copper are also etched. At or just before the time point when the titanium nitride film 14 is exposed, the etching process is switched to the second etching step or process.

Figure 1C:
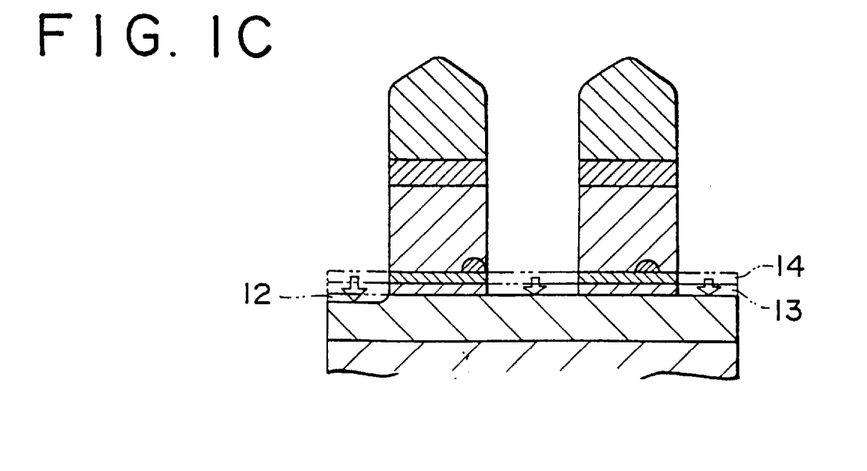

In the second etching process, the high frequency power is reduced from 80 W to 50 W while discharging in the first process is continued, and the titanium nitride film 14 and titanium film 13 are subjected to anisotropic etching as shown in FIG. 1C. Then, the top layer of the silicon dioxide film 12 is partially etched.

In the etching process, the argon gas contained in the etching gas contributes only to sputter etching. The alloy grains 18, which are contained in the above-mentioned aluminum metal film 15 and which cause residues, are not susceptible to radical reaction but rather are susceptible to sputtering by ions having the weight of argon or the like. Therefore, even if many alloy grains 18 exist in the aluminum metal film 15, the alloy grains are etched and residues due to the alloy grains are not formed.

The etching gas used in this embodiment is a gas in which boron trichloride in a conventional etching gas (i.e., a mixed gas consisting of boron trichloride of 40 sccm and chlorine of 60 sccm) is partially substituted with argon without changing the proportion of chlorine, which is the main component of the etching gas. The concentration of boron trichloride, which etches resist pattern 17 easily, is reduced; therefore, the etching speed of the resist pattern is slowed down, and the removal of resist pattern film is allowed to reduce.

In the first etching process, a high level of high frequency power, and associated ion energy, is required to remove residues. It is enough to apply such a high level of high frequency power until the aluminum metal film 15 in which the alloy grains exist is etched and removed, because the alloy grains are the cause of residues.

Figure 2A:
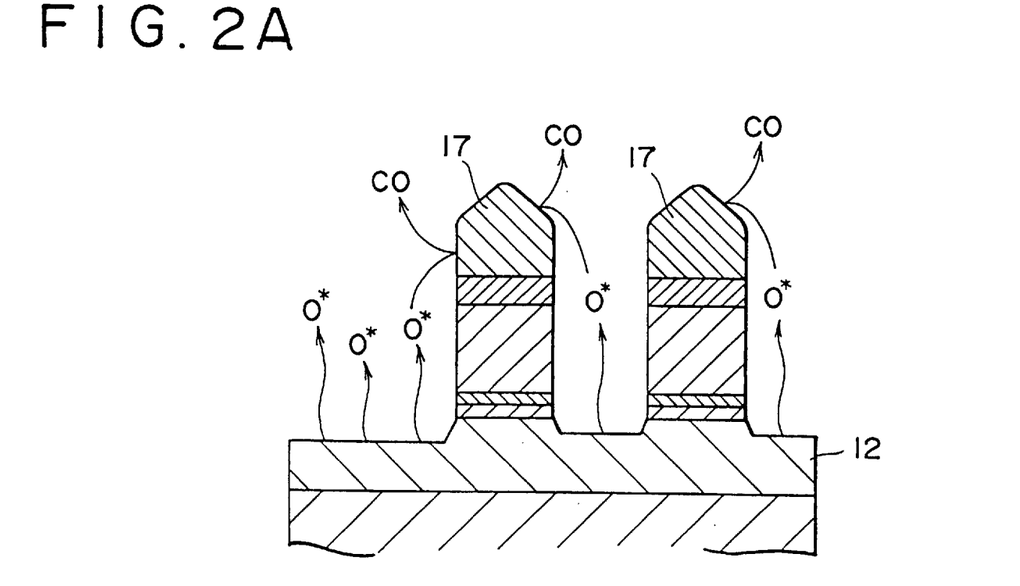
FIGS. 2A and 2B are schematic diagrams showing the relationship between high frequency power and removal of resist film.

If the first process etching condition continues, so-called over-etching, i.e., the removal of the resist pattern 17, increases rapidly. The rapid removal is attributed, as seen in FIG. 2A, to the mechanism wherein the underlying or under-layered silicon dioxide film 12 decomposes to generate oxygen radicals (O*), which then react with the resist pattern 17 to convert it to carbon dioxide gas ($CO_2$), and thus etch and remove the resist pattern 17.

Figure 2B:
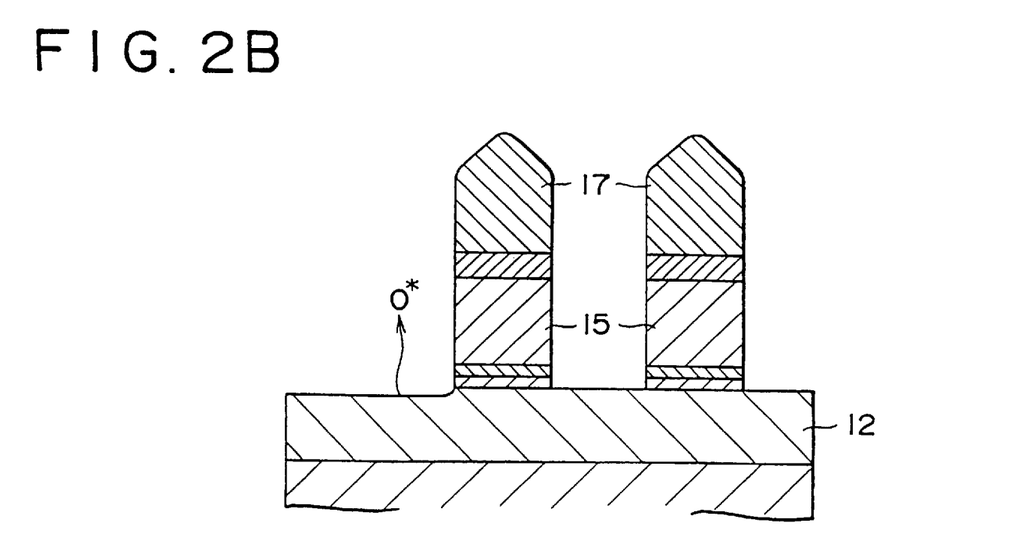

To prevent the loss of the resist pattern 17, at the time point when the under-layered silicon dioxide film 12 is exposed, or during the time period from completion of the etching of the aluminum metal film 15 to just before exposing the silicon dioxide film 12, the etching condition is switched to a mild etching condition having a sufficient selectivity ratio to the silicon dioxide film 12 (for example, where the selectivity is 16), namely, an etching condition having a low ion energy (for example, 310 eV) such that the under-layered silicon dioxide film 12 is scarcely etched (as shown in FIG. 2B). By switching to such mild etching as described, generation of oxygen radicals (O*) from the under-layered silicon oxide film 12 is reduced.

As described above, application of high frequency power of the minimum ion energy required for anisotropic processing provides a larger selectivity ratio to the resist pattern 17 and a reduced removal of the resist pattern 17.

Figure 3A:
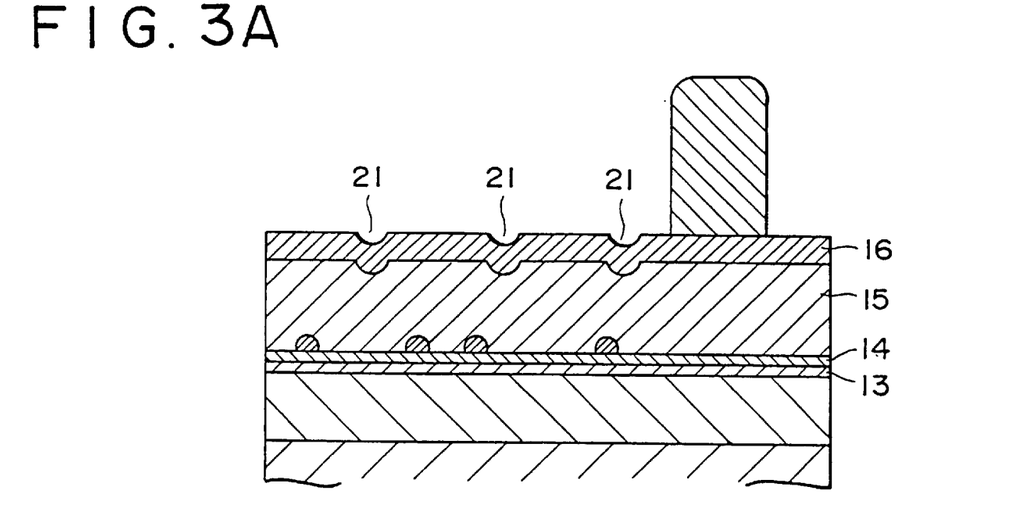
FIGS. 3A to 3C are schematic diagrams showing the relationship between high frequency power and recess copying.

As shown in FIG. 3A, during sputtering to form the titanium film 13, a titanium nitride film 14, an aluminum metal film 15, and a titanium nitride film 16 are formed in the stated order. Occasionally, large recesses or projections 21 are formed on these films.

Figure 3B:
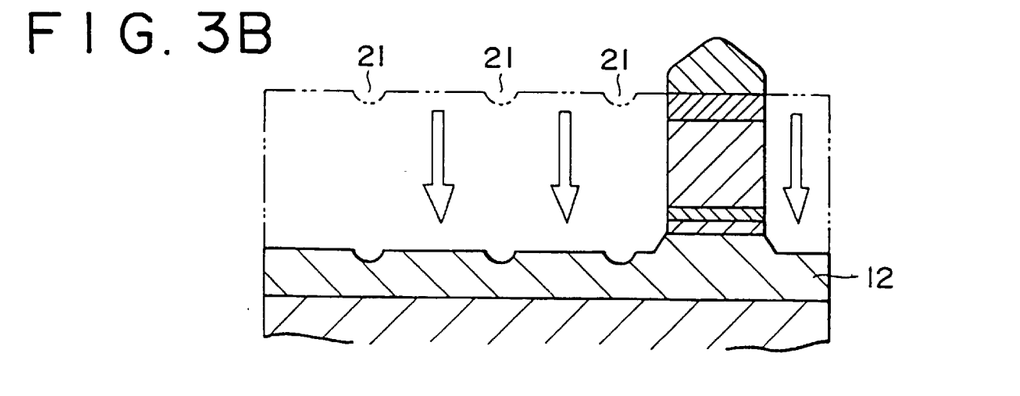

In such case, the recesses or projections 21 are copied on the surface of the silicon dioxide film 12 even though residues are not formed on the under-layered silicon dioxide film 12, as shown in FIG. 3B.

In this case also, by reducing the ion energy of the high frequency power for over etching to increase the selectivity ratio of metal film (for example, titanium film 13) to silicon dioxide film 12 (for example, the selectivity is 12), the copying of the recesses 21 is prevented.

Figure 3C:
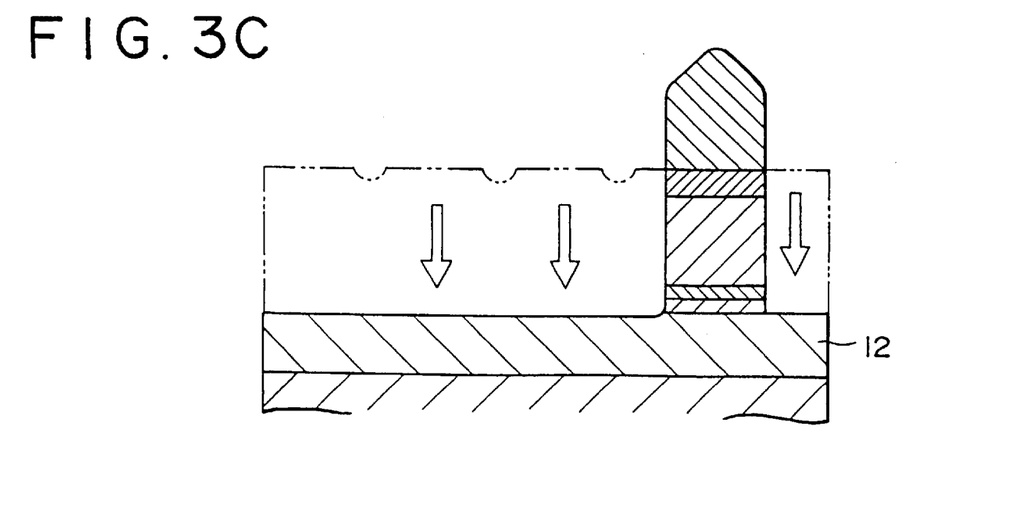

In other words, by reducing the ion energy of the high frequency power, the removal of the silicon dioxide film 12 is reduced, so that the recesses or projections 21 are not copied to the silicon dioxide film 12 as shown in FIG. 3C. Therefore, a low power application of high frequency power is favorable for the silicon dioxide film 12 because copying is prevented.

According to the above-mentioned etching condition, the condition allows the loss of the resist pattern 17 to be 400 nm or less in thickness, and the etching process is carried out without generation of residues and copying of recesses.

The removal of the under-layered silicon dioxide film 12 is-reduced, thereby, local gaps due to wiring are reduced by at least 80 nm compared with those of conventional process. As described above, a high selectivity ratio to an under layer is obtained; hence, this condition is especially advantageous in such wiring processing of devices, for example, a charge-coupled device for which the removal of an oxide film on a so-called active area seriously impacts on the performance of the device.

Next, the effect of addition of an argon as a rare gas in the etching gas is examined. The total flow rate of an etching gas is prescribed constantly to 100 sccm; the flow rate of chlorine (Cl2) is prescribed constantly to 60 sccm; and the flow rate of argon (Ar) and boron trichloride (BCl3) are varied. Aluminum metal films 15 consisting of an aluminum-copper alloy as described in FIG. 1 are etched using magnetron microwave etching equipment. Then, the pressure of the etching atmosphere is prescribed to 2.7 Pa; magnetron filament current to 400 mA; high frequency power to 120 W; and substrate temperature to 30° C. for etching respectively.

The result is shown in Table 1. Herein, the number of copied recesses are counted by microscopy.

TABLE 1

| Condi- | Flow rate of etching gas (sccm) | | | Number of residues (including the number of copied recesses or projections) |
| --- | --- | --- | --- | --- |
| tions | BCl$_3$ | Cl$_2$ | Ar | |
| 1 | 40 | 60 | 0 | 20 or less |
| 2 | 20 | 60 | 20 | 10 or less |
| 3 | 10 | 60 | 30 | 5 or less |

As shown in Table 1, the addition of more argon to etching gas results in the reduced number of residues, including copied recesses.

Then, the relationship between the high frequency power applied to a substrate while etching and the residual film thickness of a resist pattern which is to be an etching mask is examined for etching of a layer consisting of a titanium nitride film, an aluminum metal film, a titanium nitride film and titanium film using a magnetron plasma etching device. The thickness of the resist pattern was 1100 nm before the etching. The result is shown in Table 2.

TABLE 2

| | High frequency power (W) | | Residual thickness of resist pattern (nm) (initial film thickness: 1100 nm) | |
| --- | --- | --- | --- | --- |
| Condi-tions | First process | Second process | Center | Edge |
| 4 | 90 | 50 | 650 | 600 |
| 5 | 90 | 90 | 520 | 470 |

As shown in Table 2, in the condition 4, during the first process for etching the titanium nitride film and aluminum metal film, a high frequency power of 90 W is applied; and, during the second process for etching the titanium nitride film and titanium film, a high frequency power of 50 W is applied. In the condition 5, during both first and second processes, a high frequency power of 90 W is applied. It is found a thicker residual film thickness results under condition 4 than under the condition 5. Then, the first process is switched to the second process just after exposing the titanium nitride film which is formed under the aluminum metal film.

Next, the relationship between an applied high frequency power and an etching selectivity of an under layer, herein a boron phosphorus silicate glass (BPSG) film is examined. The result is shown in Table 3.

TABLE 3

| Condi-tions | High frequency power (W) | Selectivity to BPSG |
| --- | --- | --- |
| 6 | 50 | 16 |
| 7 | 70 | 8 |
| 8 | 90 | 4 |

As shown in Table 3, the layer high frequency power in the second process results in the reduced etching selectivity of the under-layered BPSG film. In other words, the under-layered BPSG film is more easily etched in a layer high frequency power condition.

Next, the relationship between the residual film thickness of the resist pattern and the number of residues when the applied high frequency power in the first process is varied is examined for etching of a layer consisting of a titanium nitride film, an aluminum metal film, a titanium nitride film, and a titanium film as described in FIG. 1 using magnetron plasma etching equipment. The result is shown in Table 4.

TABLE 4

| | High frequency power in the first | Residual thickness of resist pattern (nm) (initial film thickness: 1100 nm) | | Number of |
| --- | --- | --- | --- | --- |
| Condi-tions | process (W) | Center | Edge | residues |
| 9 | 70 | 700 | 650 | 0–3 |
| 10 | 80 | 700 | 670 | 0 |
| 11 | 90 | 630 | 630 | 0 |

As shown in Table 4, the higher wattage high frequency power in the first process results in reduced residual film thickness of the resist pattern; however, the reduction of the thickness is not so serious as to impact on the etching. The number of residues decreases to zero in the power range of 80 W or higher.

Based on the above-mentioned results, the etching condition described in the first embodiment is selected. Accordingly, an example of a preferable etching condition includes a condition that a high frequency power of 80 W (an ion energy of 520 eV) or higher is applied in the first process until etching of the aluminum metal film is completed and a high frequency power of 50 W to 60 W (and ion energy of 310 eV to 330 eV) is applied in the second process for etching the titanium nitride film which is to be the underlayer of the aluminum metal film and titanium film.

Next, the second embodiment of the present invention is described referring to the forming process diagram shown in the above-mentioned FIG. 1. Herein, a method for forming a wiring circuit is described as an example. The second embodiment is the same as the first embodiment except that the composition of the aluminum metal film is different from that of the first embodiment described hereinbefore. Therefore, the second embodiment will be described referring to the above-mentioned FIG. 1. Numerals used in this description are only for description, and the present invention is by no means limited to the structure noted by the numerals.

As shown in FIG. 1A and as described hereinbefore in the first embodiment, a silicon dioxide film 12 is formed on a substrate 11. On the silicon dioxide film 12, a titanium film 13 with a thickness of 20 nm, a titanium nitride film 14 with a thickness of 20 nm, an aluminum metal film 15 with a thickness of 500 nm, and a titanium nitride film with a thickness of 100 nm are successively deposited by sputtering. The aluminum metal film 15 herein consists of an aluminum-copper (1.0%) alloy.

One example of a sputtering condition used for the embodiment is described hereinafter.

A sputtering condition to deposit an aluminum metal film 15 consisting of an aluminum-copper (1.0%) alloy is the same as that described in the first embodiment except that a target of an aluminum alloy containing 1.0% copper is used in the second embodiment.

A sputtering condition to deposit a titanium film 13 and titanium nitride films 14 and 16 is the same as that described in the first embodiment.

Next, a resist pattern 17 which is to be an etching mask is formed with a lithography technique (for example, resist coating, exposing, developing, and baking) as in the same manner as described in the first embodiment.

In the above-mentioned prescribed conditions, the content of copper is increased to improve the reliability of wiring (for example, its resistance to electro-migration). Thereby, the condition causes more residues.

Then, etching is carried out as shown in FIGS. 1B and 1C. A magnetron plasma etching apparatus is used as the etching equipment. Detailed processing conditions are described herein under.

The etching conditions of etching gas, flow rate thereof, pressure of etching atmosphere, and magnetron filament current are prescribed to the same value as employed in the first embodiment. High frequency power is applied in two processes; that is, 100 W (an ion energy of about 630 eV) is applied in the first process, and 50 W (an ion energy of about 310 eV) is applied in the second process. A substrate temperature is 30° C.

Only the high frequency power is different between the etching condition in the first process and etching condition in the second process.

First, as shown in FIG. 1B, the titanium nitride film 16 and aluminum metal film 15 are etched in the first process. Then, high frequency power ion energy of 630 eV, which is 100 eV higher than that of the first embodiment, is prescribed to cope with the increased number of alloy grains with a larger grain size.

Then, as shown in FIG. 1C, the layer is subjected to etching in the second process. In this etching, a high frequency with lowered power is applied to etch the titanium nitride film 14 and titanium film 13 while discharging in the first process is continued. Other conditions are the same as employed for etching in the first process.

The process is switched from the first process to the second process in the same manner as described in the first embodiment just after the completion of etching of the aluminum metal film 15.

In the process of the second embodiment, in spite of a high copper concentration in the aluminum metal film, the layer is etched without causing residues and copied recesses as in the process of the first embodiment. The total thickness loss of the resist pattern is 600 nm or less and local gaps due to a wiring pattern is reduced by at least about 80 nm.

Next, the third embodiment of the present invention is described referring to the forming process diagram of FIG. 1. Herein, a method for forming a wiring pattern is described as an example.

Only the method for forming aluminum metal film is different between the above-mentioned first embodiment and the third embodiment, and the third embodiment is described again using the above-mentioned FIG. 1. Numerals used in the description are only for an example, and the scope of the present invention is by no means limited by the specific examples of the structure noted by the numerals.

As shown in FIG. 1A as described in the above-mentioned first embodiment, a silicon dioxide film 12 is formed on a substrate 11. On the silicon dioxide film 12, a titanium film 13 with a thickness of 20 nm, a titanium nitride film 14 with a thickness of 20 nm, an aluminum metal film 15 consisting of aluminum-copper (1.0%) alloy with a thickness of 500 nm, and a titanium nitride film 16 with a thickness of 100 nm are deposited successively by sputtering.

One example of a sputtering condition used for depositing is described hereinunder.

For sputtering to deposit the aluminum metal film 15 consisting of an aluminum-copper (1.0%) alloy, a target of an aluminum-copper (1.0%) alloy is used, and a reflow treatment is carried out at 480° C. Other sputtering conditions are the same as those described in the first embodiment.

The sputtering conditions to deposit the titanium film 13 and titanium nitride films 14 and 16 are the same as those described in the first embodiment.

Then as described in the first embodiment, a resist pattern 17 which is to be an etching mask is formed with a lithography technique (for example, resist coating, exposing, developing, and baking).

In the prescription of the above-mentioned conditions, a high temperature reflow treatment is employed without using a tungsten plug to simplify the process. Thereby, the size of the alloy grains consisting of aluminum-copper in the aluminum metal film 15 is larger than that in the second embodiment, and more etching residues are easily formed.

Then, the layer is etched as shown in FIGS. 1B and 1C. A magnetron plasma etching equipment is used for etching. Detailed processing conditions are described in herein under.

A mixed etching gas consisting of boron trichloride ($BCl_3$) at 10 sccm in flow rate, chlorine ($Cl_2$) at 60 sccm in flow rate, and xenon (Xe) at 30 sccm in flow rate are used. A pressure of an etching atmosphere of 667 Pa and magnetron filament current of 200 mA are prescribed. High frequency power is applied in two processes, 100 W power (corresponding to ion energy of about 630 eV) is applied in the first process, and 50 W power (corresponds to ion energy of about 310 eV) is applied in the second process. The substrate temperature is prescribed to 30° C.

Therefore, the only difference between the etching condition in the first process and the etching condition in the second process is the high frequency power.

First, as shown in FIG. 1B, in the first process the titanium nitride film 16 and aluminum metal film 15 are etched. Then, to cope with large size alloy grains, xenon, which has a larger atomic weight than argon, is used as a rare gas. The pressure of etching atmosphere is reduced to increase the mean free path of ions, thus sputtering performance is improved.

Afterward, as shown in FIG. 1C, in the second process, the titanium nitride film 14 and titanium film 13 are etched. In the second etching process, the high frequency power of 100 W is lowered to 50 W while discharging in the first process is continuing.

The process is switched from the first process to the second process in the same manner as described in the first embodiment just after the completion of etching of the aluminum metal film 15.

In the process of the third embodiment, in spite of forming the aluminum metal film by high temperature sputtering, no residue and copied recess are caused as in the process of the first embodiment. A resist pattern with a thickness of 1 micron can be etched by employing this etching condition.

As described herein above, according to the present invention, an aluminum metal film is dry-etched using an etching gas consisting of boron trichloride, a rare gas, and chlorine to sputter and remove alloy grains in the aluminum metal film by the action of the rare gas. Thus, the aluminum metal film is high quality etched without causing residues.

During etching of the aluminum metal film, the high frequency power applied to the substrate is prescribed to a power which is enough to etch alloy grains; therefore, the alloy grains are etched off and do not cause residues. Then, at or just prior to the time point when the under-layered silicone dioxide film is exposed, high frequency power is varied to such a lower power that the power is higher than the minimum value for anisotropic etching and is provided with an etching selectivity to the under-layered silicon dioxide film, thereby, the under-layered silicon dioxide film is scarcely etched. Local gaps due to etching are small and loss of resist is significantly reduced.

Thus, highly accurate high quality-etching is realized.

What is claimed is:

1. A method for etching an aluminum metal film in which said aluminum metal film is formed on a substrate and is processed by dry-etching, wherein the etching process comprising:

using a mixed gas consisting of boron trichloride, a rare gas, and chlorine;

a first etching step of etching said aluminum metal film with said mixed gas at a high frequency power sufficient for anisotropic etching of said aluminum metal film and for etching and removing alloy grains contained in said aluminum metal film, and a second etching step wherein said high frequency power is reduced, at or just before a point in time when a silicon dioxide film layered under said aluminum metal film is exposed, to a level which is lower than that used in said first etching step and higher than the minimum power for anisotropic etching.

2. The method of etching an aluminum metal film as claimed in claim 1, wherein said aluminum metal film consists of an aluminum-copper alloy.

3. The method of etching an aluminum metal film as claimed in claim 1, wherein said etching method involves etching using magnetron plasma etching.

4. The method of etching an aluminum metal film as claimed in claim 1, wherein said rare gas is argon or xenon.

5. The method of etching an aluminum metal film as claimed in claim 1, wherein the high frequency power applied in the first etching step is converted to an ion energy of 530 eV or higher, and the high frequency power applied in the second etching step is converted to an ion energy of 310 to 330 eV.

6. The method of etching an aluminum metal film as claimed in claim 1, wherein the high frequency power applied in the first etching step is approximately 80 W or higher and the high frequency power applied in the second etching step is 50 W.

7. A method as claimed in claim 1, wherein said using a mixed gas comprises providing said mixed gas at a total flow rate of 100 sccm.

8. A method as claimed in claim 7, wherein said employing a mixed gas comprises providing said chlorine at a flow rate of 60 sccm.

9. A method as claimed in claim 8, wherein said employing a mixed gas comprises providing said boron trichloride at a flow rate of 10 sccm and said rare gas at a flow rate of 30 sccm.

10. A method as claimed in claim 1, wherein said employing a mixed gas comprises providing said chlorine at a flow rate of 60 sccm.

11. A method as claimed in claim 1, wherein said using a mixed gas comprises providing said mixed gas at a pressure of 1.067 kPa.

12. A method as claimed in claim 1, wherein said method further comprises maintaining said substrate at a temperature of 30° C. during said etching.

13. A method of etching an aluminum metal film and an underlying barrier layer which are formed on a substrate comprising:

employing a mixed gas as an etching agent, said mixed gas comprising boron trichloride, a rare gas, and chlorine;

etching said metal film with said mixed gas at a first high frequency power level which is sufficient for anisotropic etching of said aluminum metal film and for etching and removing alloy grains contained in said aluminum metal film;

etching said barrier layer with said mixed gas, to expose an underlying insulating layer, at a second high frequency power level which is less than said first high frequency power level.

14. A method as claimed in claim 13, wherein said employing a mixed gas comprises providing said mixed gas at a total flow rate of 100 sccm.

15. A method as claimed in claim 14, wherein said employing a mixed gas comprises providing said chlorine at a flow rate of 60 sccm.

16. A method as claimed in claim 15, wherein said employing a mixed gas comprises providing said boron trichloride at a flow rate of 10 sccm and said rare gas at a flow rate of 30 sccm.

17. A method as claimed in claim 13, wherein said employing a mixed gas comprises providing said chlorine at a flow rate of 60 sccm.

18. A method as claimed in claim 13, wherein said barrier layer comprises a TiN layer over a Ti layer.

19. A method as claimed in claim 13, wherein said employing a mixed gas comprises providing said mixed gas at a pressure of 1.067 kPa.

20. A method as claimed in claim 13, wherein said method further comprises maintaining said substrate at a temperature of 30° C. during said etching.

* * * * *